(12) United States Patent
Hirler et al.

(10) Patent No.: US 7,829,940 B2
(45) Date of Patent: Nov. 9, 2010

(54) SEMICONDUCTOR COMPONENT ARRANGEMENT HAVING A COMPONENT WITH A DRIFT ZONE AND A DRIFT CONTROL ZONE

(75) Inventors: Franz Hirler, Isen (DE); Thoralf Kautzsch, Dresden (DE); Anton Mauder, Kolbermoor (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 12/163,037

(22) Filed: Jun. 27, 2008

(65) Prior Publication Data

US 2009/0322417 A1 Dec. 31, 2009

(51) Int. Cl.
*H01L 29/732* (2006.01)
(52) U.S. Cl. .................. 257/329; 257/330; 257/341; 257/209; 257/E29.183
(58) Field of Classification Search .......... 257/329, 257/330, 341, E29.183, 209
See application file for complete search history.

(56) References Cited

U.S. PATENT DOCUMENTS

| 2002/0060340 | A1* | 5/2002 | Deboy et al. ................. 257/330 |
| 2002/0158304 | A1* | 10/2002 | Haupt et al. ................. 257/529 |
| 2005/0186705 | A1* | 8/2005 | Jackson et al. .............. 438/106 |
| 2007/0023830 | A1* | 2/2007 | Pfirsch et al. ................ 257/341 |

* cited by examiner

*Primary Examiner*—Davienne Monbleau
*Assistant Examiner*—Hajar Kolahdouzan
(74) *Attorney, Agent, or Firm*—Dicke, Billig & Czaja, PLLC

(57) ABSTRACT

Disclosed is a semiconductor including a component having a drift zone and a drift control zone. A first connection zone is adjacent to the drift zone and is doped more highly than the drift zone. A drift control zone is arranged adjacent to the drift zone and is coupled to the first connection zone. A drift control zone is dielectric arranged between the drift zone and the drift control zone. At least one rectifier element is arranged between the first connection zone and the drift control zone. A charging circuit is connected to the drift control zone.

20 Claims, 9 Drawing Sheets

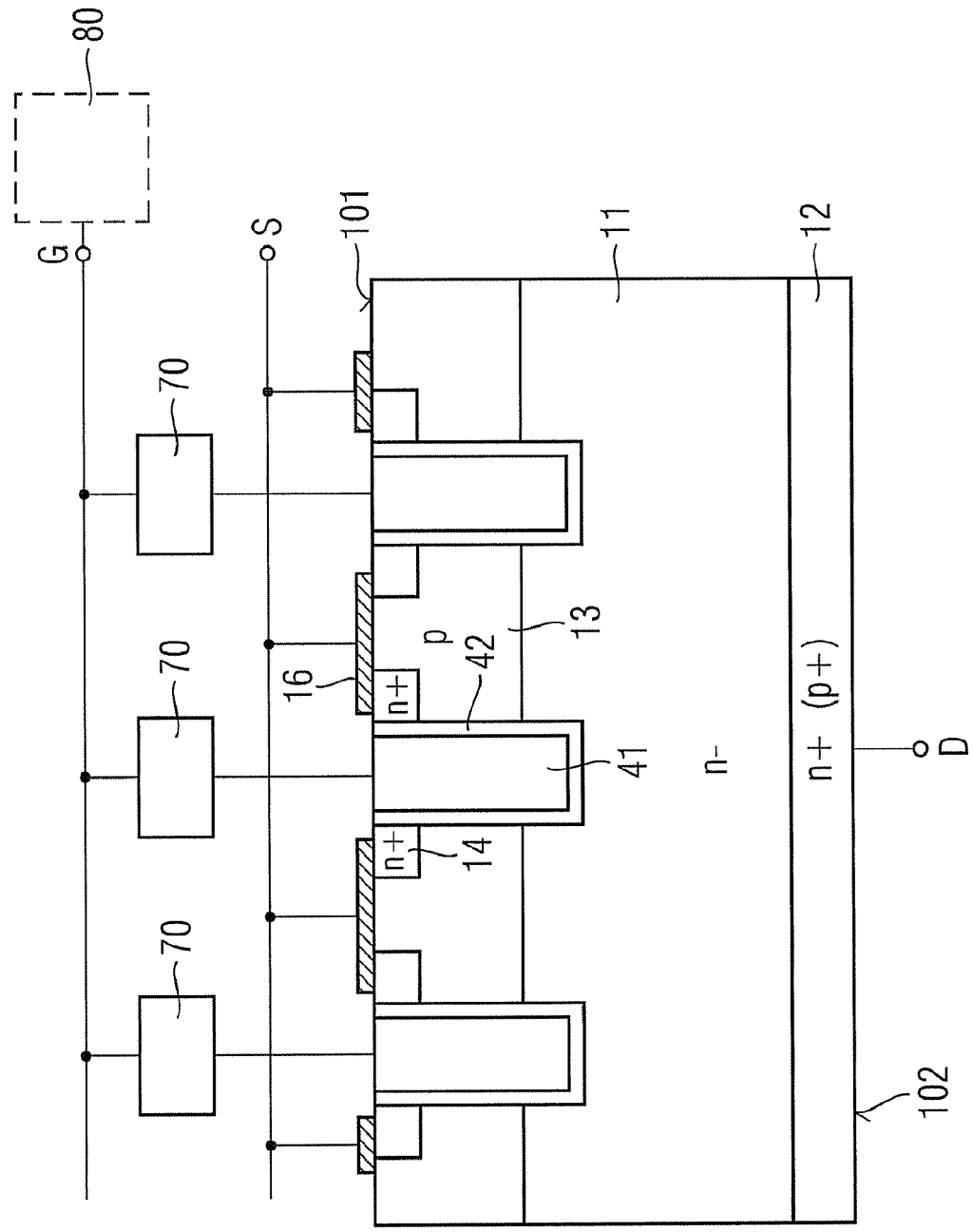

SEMICONDUCTOR COMPONENT ARRANGEMENT HAVING A COMPONENT WITH A DRIFT ZONE AND A DRIFT CONTROL ZONE

BACKGROUND

In semiconductor components having a drift zone and a drift control zone, when the component is driven in the on state, the drift control zone serves for controlling a conducting channel in the drift zone along a drift control zone dielectric arranged between the drift zone and the drift control zone. The conducting channel brings about a reduction of the on resistance of the component in comparison with such components which do not have a drift control zone.

For effectively controlling a conducting channel in the drift zone along the drift control zone dielectric, the drift control zone dielectric should be as thin as possible. On the other hand, the drift control zone dielectric should reliably isolate the electrical potentials of the drift zone and of the drift control zone in order actually to enable the above-explained control of a channel in the drift zone, that is to say that a short circuit between the drift zone and the drift control zone via the drift control zone dielectric should be avoided. In the case of components constructed in cellular fashion and having a multiplicity of drift zones connected in parallel and drift control zones arranged adjacent to the drift zones, although a short circuit between one of the drift zones and the drift control zone adjacent thereto would not significantly impair the functionality of the entire component, increased driving losses would nonetheless occur with the component in the on state. Driving losses are determined by electrical power required to keep the component in a specific switching state (on state or off state) and to change the switching state.

SUMMARY

One embodiment relates to a semiconductor component arrangement including a semiconductor component having a drift zone, a first connection zone, which is adjacent to the drift zone and is doped more highly than the drift zone, a drift control zone, which is arranged adjacent to the drift zone and is coupled to the first connection zone, a drift control zone dielectric arranged between the drift zone and the drift control zone, at least one pn junction arranged between the first connection zone and the drift control zone; a charging circuit connected to the drift control zone; a decoupling element connected between the charging circuit and the drift control zone, the decoupling element being designed to interrupt an electrically conductive connection between the charging circuit and the drift control zone depending on a temperature prevailing at the decoupling element, a voltage present at the decoupling element or a current flowing through the decoupling element, or a resistance element connected between the charging circuit and the drift control zone and having a resistance value of greater than 1 MΩ.

One embodiment relates to a MOS transistor including a gate connection; at least one gate electrode; a decoupling element between the gate connection and the at least one gate electrode, the decoupling element being designed to interrupt an electrically conductive connection between the gate connection and the gate electrode depending on a temperature prevailing at the decoupling element, a voltage present at the decoupling element or a current flowing through the decoupling element, or a resistance element connected between the gate connection and the at least one gate electrode and having a resistance value of greater than 1 MΩ.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 11 illustrates a MOS transistor having a plurality of transistor cells which each have a gate electrode to which a decoupling or resistance element is connected.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Figure 1:
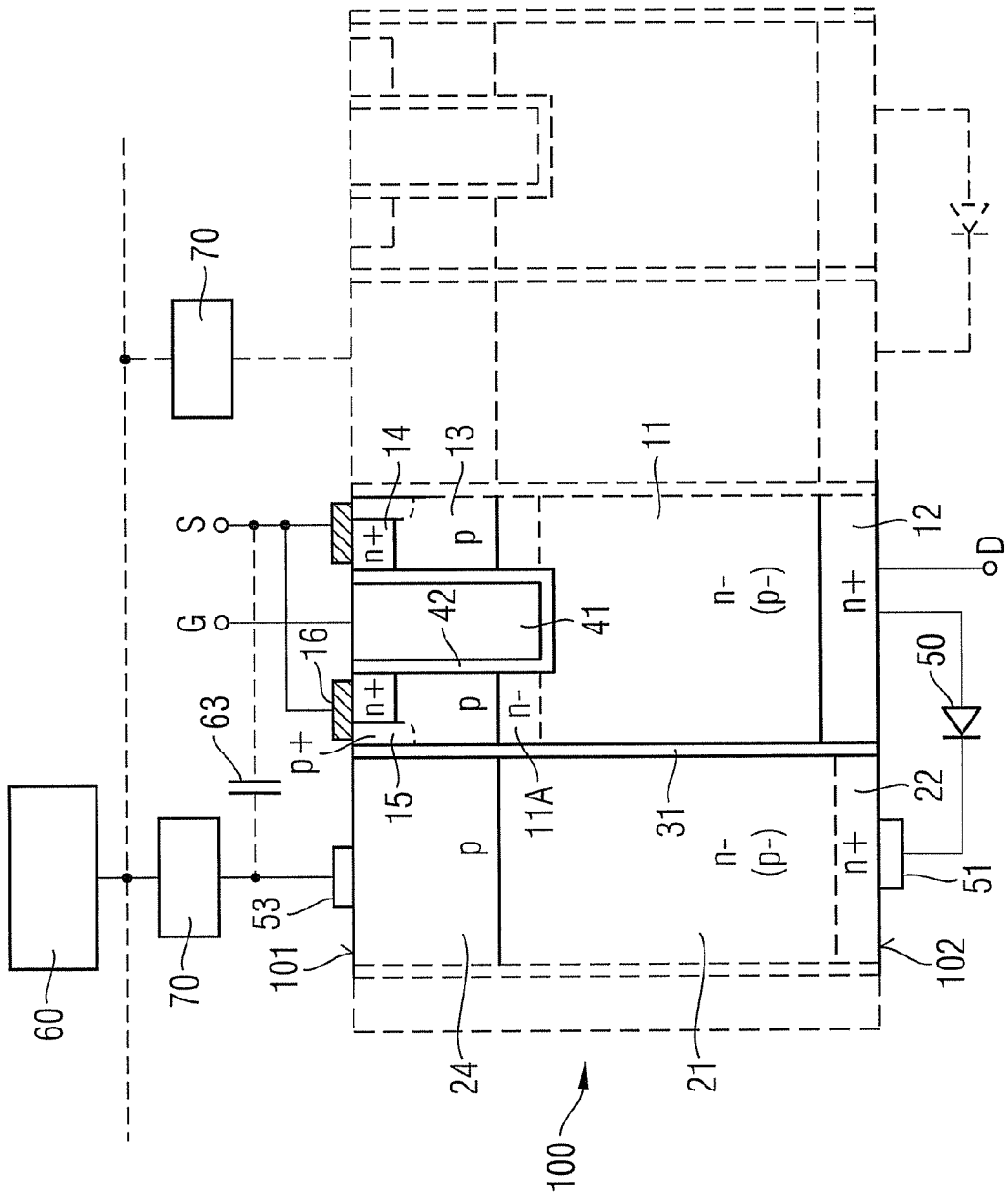
FIG. 1 schematically illustrates a semiconductor component arrangement including a semiconductor component having a drift zone and a drift control zone, a charging circuit and a decoupling or resistance element connected between the charging circuit and the drift control zone.

FIG. 1 schematically illustrates a semiconductor component arrangement including a semiconductor component, a charging circuit and a decoupling or resistance element. The semiconductor component has a semiconductor body 100 with component zones arranged in the semiconductor body. FIG. 1 schematically illustrates a cross section through the semiconductor body. The charging circuit and the decoupling or resistance element and their mutual interconnection and their interconnection with the semiconductor component are illustrated as a block diagram in FIG. 1.

The semiconductor body 100 is composed of silicon, for example, and has a first side 101, which is referred to hereinafter as front side, and a second side 102, which is referred to hereinafter as rear side. FIG. 1 illustrates a vertical cross section through the semiconductor body 100, that is to say a cross section in a sectional plane running perpendicular to the front side 101 and the rear side 102.

The component additionally includes a drift zone 11 arranged in the semiconductor body 100, a drift control zone 21 arranged adjacent to the drift zone 11, and a dielectric layer 31 arranged between the drift control zone 21 and the drift zone 11, the dielectric layer also being referred to hereinafter as drift control zone dielectric. The drift control zone 21 is composed of a monocrystalline semiconductor material, for example.

In the semiconductor component illustrated in FIG. 1, the drift zone 11 is part of a MOSFET structure and is arranged in a current flow direction between a first component zone 12 and a second component zone 13 in the semiconductor body 100. In the component illustrated in FIG. 1, the current flow direction corresponds to a vertical direction, that is to say a direction running perpendicular to the front side 101 and the rear side 102, of the semiconductor body 100. In the MOSFET structure illustrated, the first component zone is a drain zone 12, the second component zone 13 is a body zone, to which a source zone 14 is adjacent, the body zone 13 separating the drift zone 11 and the source zone 14 from one another. A gate electrode 41 is present for controlling a conducting channel in the body zone 13 between the source zone 14 and the drift zone 11, the gate electrode being dielectrically insulated from the body zone 13 by a gate dielectric 42.

Contact is made with the source zone 14 by a source electrode 16. In the example illustrated, the source electrode 16 additionally makes contact with the body zone 13 and thereby short-circuits the source zone 14 and the body zone 13. For the low-resistance connection of the source electrode 52 to the body zone 13, a connection zone 15 of the same conduction type as the body zone 13 and doped more highly than the body zone 13 can be provided, the connection zone being arranged between the source electrode 52 and the body zone 13.

The MOSFET structure illustrated for elucidation purposes is a structure of a normally off n-channel MOSFET. In this case, the source zone 14 and the drain zone 12 are n-doped, and therefore doped complementarily to the body zone 13, which is p-doped in this case. In this component, the gate electrode 41 serves for controlling an inversion channel in the body zone 13 between the source zone 14 and the drift zone 11, the drift zone 11 being n-doped in the example illustrated in FIG. 1. The structure illustrated is furthermore a vertical transistor structure; in this case, the drain zone 12, the drift zone 11, the body zone 13 and the source zone 14 are arranged adjacent to one another in a vertical direction of the semiconductor body 100. In the example illustrated, the vertical direction of the semiconductor body 100 corresponds to the (main) current flow direction of the component, in which, when the component is driven in the on state, current flows through the drift zone 11 in a manner that will be explained below. The transistor structure illustrated is additionally a trench transistor structure. In this case, the gate electrode 41 extends into the semiconductor body 100 in the vertical direction proceeding from the front side 101 and reaches through the source zone 14 and the body zone 13 right into or at least as far as the drift zone 11. In this case, the gate electrode 41 is insulated from the aforementioned component zones by the gate dielectric 42. It should be pointed out that the MOSFET structure illustrated should be understood merely as an example and was chosen for elucidation purposes. It goes without saying that any other MOSFET structures can be used, for example, those that will be explained with reference to FIGS. 9 and 10.

In FIG. 1, the reference symbols D, S and G designate drain, source and gate connections of the component, which are merely illustrated schematically.

In the example illustrated, the drift control zone 21 is arranged adjacent to the drift zone 11 in a lateral direction running perpendicular to the vertical direction, and is dielectrically insulated from the drift zone 11 by the drift control zone dielectric 31. Furthermore, the drift control zone 21 is connected to the drain zone 12 via a rectifier element 50. The rectifier element is a bipolar diode, for example, and is merely illustrated schematically by an electrical circuit symbol in FIG. 1. The rectifier element can be realized in any desired manner; by way of example, it can be integrated in the semiconductor body 100 but can also be realized as an external component. Instead of a bipolar diode, for example, a Schottky diode is also suitable as the rectifier element.

The rectifier element 50 can be electrically connected to the drift control zone via a more highly doped connection zone 22. In this case, the doping species of the connection zone depends on the type of transistor and is a donor doping (n-type doping) for an n-conducting component. In this case, the connection zone 22 and/or a contact electrode 51 (illustrated by dashed lines) arranged between the drift control zone 21 and the rectifier element 50 can be embodied over the whole area or else just locally. The regions of the connection zone 22 which are not connected to a contact electrode 51 can be covered with an insulator layer (not illustrated).

In the component illustrated in FIG. 1, the rectifier element makes contact with the connection zone 22 in the region of the rear side of the semiconductor body 100. In a manner not illustrated more specifically, there is also the possibility of leading the connection zone 22 as far as the front side, and of connecting the rectifier element 50 to the connection zone in the region of the front side 101—optionally via a contact electrode.

The semiconductor component likewise has to reduce the reverse voltage in a lateral direction at its boundaries. A large selection of known edge terminations are available for this purpose, such as field plate edges, field ring edges, edge terminations based on a lateral variation of the doping at the surface, and a combination of the aforementioned principles. Such an edge termination is not illustrated in the Figures. It suffices to extend the drift control zone 21 in a direction of the plane of the drawing through as far as below such an edge termination. Drain potential is present outside the edge termination, that is to say that there is no space charge zone present in these regions in the semiconductor body and also near the front side 101 in the off-state case, such that the rectifier element 50 can be connected to a contact electrode, near the surface, of the drift control zone 21.

The rectifier element is connected up in such a way that it prevents a potential equalization between an electrical potential of the drift control zone 21 and an electrical potential of the drain zone 12 when the component is driven in the on state. The rectifier element 50 makes it possible, when the component is driven in the on state, for the drift control zone 21 to assume an electrical potential that differs from the electrical potential of the drain zone 12 or the drift zone 11 in such a way that a conducting channel can form in the drift zone 11—under the control of the drift control zone 21—along the drift control zone dielectric 31. In the n-conducting component having an n-doped drift zone 11 as illustrated in FIG. 1, in this case the electrical potential of the drift control zone 21 when the component is driven in the on state lies above the drain potential and the conducting channel along the drift control zone dielectric 31 is an accumulation channel. In the case of a p-channel MOSFET (not illustrated), in which the doping types of the individual component zones are complementary to the doping types illustrated in FIG. 1, the electrical potential of the drift control zone with the component driven in the on state is below the drain potential and the polarity of the rectifier element should then be reversed in comparison with the rectifier element in accordance with FIG. 1.

The dielectric strength of the rectifier element is chosen, for example, such that the reverse voltage of the rectifier element is higher than the potential differences that occur during normal operation between the drift control zone 21 and the drift zone 11 and respectively the drain zone 12 if the component has been driven in the on state. The dielectric strength is between 10 V and 100 V, for example. To summarize, the rectifier element prevents the drift control zone 21 from being discharged in a direction of the drain zone 12 when the component is driven in the on state, provided that the potential difference between the drift control zone 21 and the drain zone 12 does not exceed the breakdown voltage of the rectifier element 50.

When the component is driven in the off state, the rectifier element 50 couples the drift control zone 21 to the drain zone 12 in terms of potential. The drift control zone 21 is realized in such a way that a space charge zone can propagate in the drift control zone 21—in the same way as in the drift zone 11—when the component is driven in the off state. For this purpose, the drift control zone 21 is composed of a monocrystalline semiconductor material, for example.

The basic functioning of the semiconductor component illustrated in FIG. 1 is explained below: the component illustrated is turned on if a voltage is present between the drain zone 12 and the source zone 14 and if there is present at the gate electrode 41 a drive potential suitable for forming an inversion channel in the body zone 13. In the case of the n-MOSFET illustrated, the voltage to be applied between drain and source D, S is a positive voltage and the drive potential of the gate electrode 41 is a positive potential with respect to source potential. When the component is driven in the on state, in static normal operation the drift control zone 21 is additionally charged to an electrical potential that lies above the electrical potential of the drain zone 12 and thus above the electrical potential of the drift zone 11. As a result of this, a conducting channel—an accumulation channel in the example—forms along the drift control zone dielectric 31 in the drift zone 11 and brings about a significant reduction of the on resistance of the illustrated component in comparison with a component which does not have such a drift control zone. In this case, the electrical potential in the drift control zone 21 lies, for example, between approximately 10 V and 100 V above the electrical potential of the source zone. If, as e.g., in short circuit operation, a higher electrical potential is present at the drain zone 12 than at the drift control zone 21, then no or only a short accumulation channel forms in the drift zone 11.

Charge carriers required for charging the drift control zone 21 to an electrical potential that lies above the electrical potential of the drift zone 11 are provided by a charging circuit 60, which is connected to the drift control zone 21. A contact electrode 53 and a doped connection zone 24, with which contact is made by the contact electrode, may be present for the purpose of connecting the charging circuit 60 to the drift control zone 21. In this case, the connection zone 24 can be doped highly enough that an ohmic contact with the connection electrode 53 is achieved. The conduction type of the connection zone 24 is chosen such that it is opposite to the conduction type of the component. In the case of an n-conducting component, therefore, the connection zone 24 is p-doped and vice versa. It should be noted in this connection that the conduction type of the component is determined by the doping type of the source zone 14.

The connection zone 24 is adjacent to the drift control zone 21, in which case the connection zone 24 can extend, as illustrated in FIG. 1, over the entire surface of the drift control zone 21 or only over parts of the surface of the drift control zone 21. The connection zone 24 can be doped complementarily to the drift control zone 21 (as illustrated), but can also be of the same conduction type as the drift control zone 21. In the case of the n-MOSFET illustrated, a complementarily doped, that is to say in the example p-doped connection zone 24 provides for reducing the contact resistance between the drift control zone 21 and the connection electrode 53 and, in the on state, provides the holes that are required for forming the accumulation channel along the drift control zone dielectric 31 in the drift control zone 21. It should be pointed out in this connection that the drift control zone 21, contrary to the illustration of FIG. 1, can also be p-doped—and thus doped complementarily to the drift zone 11—or intrinsic.

The component illustrated in FIG. 1 is turned off when no or a positive voltage is present between drain D and source S and a drive potential suitable for forming an inversion channel in the body zone 13 is not present at the gate electrode 41. In this case, a space charge zone propagates in the drift zone 12 proceeding from the pn junction between the drift zone 11 and the body zone 13. In a manner corresponding to that in the drift zone 11, a space charge zone propagates in the drift control zone 21 when the component is turned off. These space charge zones propagating in the drift zone 11 and the drift control zone limit the voltage difference between the drift zone 11 and the drift control zone 21 and thereby protect the drift control zone dielectric 31 against a voltage breakdown when the component is turned off. Electrical charge that was previously present in the drift control zone in the on state and caused a conducting channel to form in the drift zone along the drift control zone dielectric flows away from the drift control zone 21 upon the transition of the component from on-state to off-state operation. For buffer-storing this electrical charge until a next transition of the component from off-state to on-state operation, a storage capacitance 63 can optionally be provided, which is connected between the connection zone 24 and the source zone 14 or the source electrode 16. The storage capacitance 63 can be integrated in the semiconductor body 100, but can also be an external capacitance.

The doping concentrations of the drift zone 11 and of the drift control zone 21 lie in the same range, for example. These doping concentrations depend for instance indirectly proportionally on the required blocking capacity between drain and source. They are approximately $1.4 \cdot 10^{14}$ cm$^{-3}$ or less, for example, for a blocking capacity of 600 V.

The component can be constructed in cellular fashion, that is to say can have a number of component structures of identical type, transistor cells, as is illustrated by dashed lines in FIG. 1. In this case, the individual transistor cells are connected in parallel by the gate electrodes of the individual transistor cells being electrically conductively connected to one another, by the source zones of the individual transistor cells being electrically conductively connected to one another and by the drain zones 12 of the individual transistor cells being conductively connected to one another. In the case of a component having the component structures illustrated in FIG. 1, two transistor cells respectively share a drift control zone 21. The individual transistor cells can be formed in strip-shaped fashion; the component zones illustrated then extend in elongated fashion in a direction running perpendicular to the plane of the drawing illustrated in FIG. 1. It goes without saying that any other transistor cell geometries can also be employed, such as, for example, rectangular, in one embodiment square, transistor cells, hexagonal transistor cells or any polygonal or round transistor cells.

On the other hand, any desired geometries of the drift control zones 21 which are followed by the geometry of the drift zone 11 and thus the geometry of the transistor cells are also conceivable. Thus, the drift control zones 21, as illustrated in FIG. 1, can be embodied in elongated fashion in a direction running perpendicular to the plane of the drawing or else as, for example, rectangular, in one embodiment square, hexagonal or arbitrarily polygonal or round structures.

The conductivity of the conducting channel which is controlled by the drift control zone 21 and is formed along the dielectric layer 31 in the drift zone 11 is crucially determined by the thickness of the dielectric layer 31. In the example illustrated, the thickness of the dielectric layer 31 is the dimension thereof in a lateral direction of the semiconductor body. In the component illustrated in FIG. 1, the channel that is formed along the dielectric layer 31 is an accumulation channel, that is to say that electrons are accumulated along the dielectric layer 31 under the control of the electrical potential in the drift control zone 21. For a given potential of the drift control zone 21, the accumulation effect is all the more pronounced here, the thinner, or the smaller the thickness of, the dielectric layer 31 or the higher its dielectric constant. Any dielectric materials such as e.g., oxides or nitrides and also high-dielectric (high-k) materials are suitable as material for the dielectric layer 31.

Particularly in the case of a cellularly constructed semiconductor component having a large number, for example, thousands, of the transistor cells illustrated, the total area of the dielectric layer 31 present in the component is considerable. Precisely when producing thin dielectric layers there is the risk of defects arising which, in the present case, would lead locally to a short circuit between the drift zone 11 and the drift control zone 21. The probability of such a defect being present at a location in the component in this case increases as the area of the dielectric layer present increases. Such a local short circuit between the drift zone 11 and the drift control zone 21 as a result of a defective location of the dielectric layer 31 has the following effects: firstly, the on resistance of the affected transistor cell increases since, owing to the short circuit between the drift zone 11 and the drift control zone 21, an electrical potential difference suitable for forming a conducting channel along the dielectric layer 31 cannot build up in the drift control zone 21. Secondly, the driving losses of the component increase since electrical charge fed to the drift control zone 21 by the charging circuit 60 when the component is driven in the on state flows away into the drift zone 11 via the defective location in the dielectric layer 31. The charge lost in this way has to be made available anew during each switching operation and be continuously resupplied during the switched-on duration, which overall increases the driving losses of the component. Customary drive circuits for MOS transistors often do not have the performance to provide this increased static driving power.

In order to avoid the abovementioned negative consequences which can arise in the case of a defective location of the dielectric layer 31, a decoupling or resistance element 70 is provided, which is connected between the charging circuit 60 and the drift control zone 21. In the example illustrated, the decoupling or resistance element 70 is connected between the charging circuit 60 and the connection zone 24 of the drift control zone 21. A plurality of such decoupling or resistance elements 70 are provided in the case of a cellularly constructed component having a plurality of drift control zones 21. Thus, such a decoupling or resistance element can be connected in one embodiment between each of the drift control zones 21 and the charging circuit 60. Furthermore, there is also the possibility of assigning a decoupling or resistance element to a respective group of drift control zones 21. The decoupling or resistance element 70 is then connected between the charging circuit 60 and the drift control zones 21 of the group.

Figure 2:
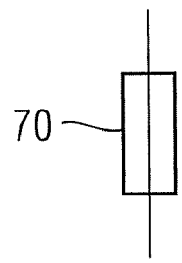
FIG. 2 illustrates a realization of the decoupling or resistance element as a fuse.

Referring to FIG. 2, the decoupling or resistance element 70 is an electrical fuse element, for example, which triggers depending on a temperature prevailing in the region of the fuse element, depending on an electrical voltage present across the fuse element or depending on a current flowing through the electrical fuse element. This fuse element 70 assumes in each case one of two different operating states: a non-triggered operating state, in which an electrical resistance of the fuse element has a first value; or a triggered operating state, in which the electrical fuse element has a second resistance value, which is significantly higher than the first resistance value and which, in one embodiment, can tend toward infinity. Such electrical fuse elements are known, in principle, and can be realized in any known manner. The electrical fuse element 60 can be in one embodiment a fuse such as are also used in integrated circuits in order, for example, to program switching states or to adjust integrated circuits.

Figure 3:
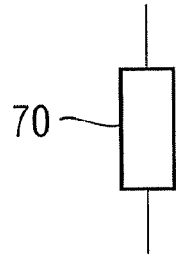
FIG. 3 illustrates a realization of the decoupling or resistance element as a nonreactive resistor.

Referring to FIG. 3, there is furthermore the possibility of realizing the decoupling or resistance element 70 as a resistance element having a resistance value of greater than 1 MΩ. The resistance value can be in one embodiment greater than 10 MΩ or even greater than 100 MΩ.

The functioning of the semiconductor component is explained below both for the case of a fuse element connected between the charging circuit 60 and the drift control zone 21 and for the case of a resistance element connected between the charging circuit 60 and the drift control zone 21 and having a resistance value of greater than 1 MΩ. If a fuse element 70 is connected between the charging circuit 60 and the drift control zone 21 and if there is no defective location present in the dielectric layer 21, then the semiconductor component functions as explained above, that is to say that when the component is driven in the on state, the drift control zone 21 is charged to an electrical potential which brings about the formation of an accumulation channel in the drift zone 11 along the dielectric layer 31. When the component is driven in the off state, the voltage present between drain D and source S is essentially dropped across the drift zone 11, in which a space charge zone forms proceeding from the pn junction between the body zone 13 and the drift zone 11. A corresponding space charge zone forms in the drift control zone 21, which results overall in a low voltage loading of the dielectric layer 31 in the off-state case. If the dielectric layer 31 has a defective location that locally short-circuits the drift zone 11 and the drift control zone 21, then when the component is driven in the on state, a charging current flows from the charging circuit 60 into the drift control zone 21 not only at the beginning of driving in the on state, but permanently. Owing to the short circuit, in this case the drift control zone 21 cannot be charged to the electrical potential required for forming an accumulation channel. The fuse element 70 is formed, for example, in such a way that it triggers in the case of such a permanently flowing charging current and thereby permanently decouples the drift control zone 21 from the charging circuit 60. For this purpose, the fuse element is realized, for example, in such a way that it overheats as a result of the permanently flowing current and thereby melts or triggers.

With the triggering of the fuse element 70, the affected drift control zone, that is to say the drift control zone 21 adjoining the dielectric layer having the defective location, is permanently deactivated. A deactivated drift control zone 21 is no longer suitable for controlling a conducting channel in the respectively adjacent drift zone 11. As a result, although the on resistance of those transistor cells whose drift control zone 21 was deactivated rises, the driving losses are reliably limited in this way. Furthermore, in the case of a component having thousands of transistor cells connected in parallel even the deactivation of the drift control zones of a plurality of transistor cells does not become significantly apparent in the total on resistance of the component.

A self-triggering fuse element can be dimensioned in such a way that—as described above—it triggers when a current permanently flows through it during normal operation. However, the fuse element 70 can also be dimensioned in such a way that it triggers only under specific test conditions chosen such that they do not occur during normal disturbance-free operation of the component. The test conditions are produced, for example, directly after the production of the component or at regular intervals during operation and serve to trigger those fuse elements which are connected to a drift control zone 21 having a defective drift control zone dielectric 31. During such test conditions, the drift control zone dielectric 31 is, for example, exposed to a particularly high electrical loading, that is to say that a particularly high voltage is applied to the drift control zone dielectric 31, which, in the case of a defect in the drift control zone dielectric 31, leads to a short-circuit current in the associated drift control zone 21 which is higher than such a short-circuit current during normal operation of the component. This short-circuit current that is higher during the test conditions has the effect that the associated fuse element 70 triggers more reliably or more rapidly. In this case, the triggering threshold of a fuse element that is to be triggered during the test can be raised in comparison with a fuse element that is to be triggered during normal operation, in order thereby to ensure that the fuse element does not trigger inadvertently during normal operation by virtue of the driving current.

Moreover, it is also possible to use fuse elements which are triggered in a targeted manner externally, such as e.g., by a laser pulse or a momentary high triggering current. The use of such fuse elements presupposes a device test in which the individual transistor cells or groups of transistor cells are tested independently of one another with regard to the drift control zone dielectric being free of defects. If a defective drift control zone dielectric 31 is detected in the context of such a test, then the fuse element 70 is triggered in a targeted manner, e.g., by using a laser pulse or a high melting current that can be coupled directly into the relevant fuse element 70 e.g., via needles.

In contrast to a fuse element, a high-value resistance element 70 between the charging circuit 60 and the drift control zone 21 does not completely decouple the drift control zone 21 from the charging circuit 60 when the dielectric layer 31 has a defective location. However, the high-value resistance element limits the current which can flow away from the charging circuit 60 into the drift zone 11 via the drift control zone 21 and the defective location in the dielectric layer 31, whereby the driving losses are reduced overall.

In order that the resistance element 70 does not unnecessarily slow down the charging of the drift control zone 21 and thus the formation of the accumulation channel along the drift control zone dielectric 31 during operation, it is possible to provide a storage capacitance 63 between the connection zone 24 and the source zone 14, which, in the off-state case, stores the charge which enables, in the on-state case along the drift control zone dielectric 31, the accumulation charge in the drift zone 11 and hence the low on-state losses. Only when the component is first switched on is the storage capacitance 63 charged slowly via the resistance element 70, which leads to a slower switching behavior once. By contrast, if the drift control zone dielectric 31 of a cell is defective, whereby the charge stored in the capacitance 63 "is lost", then the resistance element 70 limits the losses resulting from continuous recharging.

Figure 4:
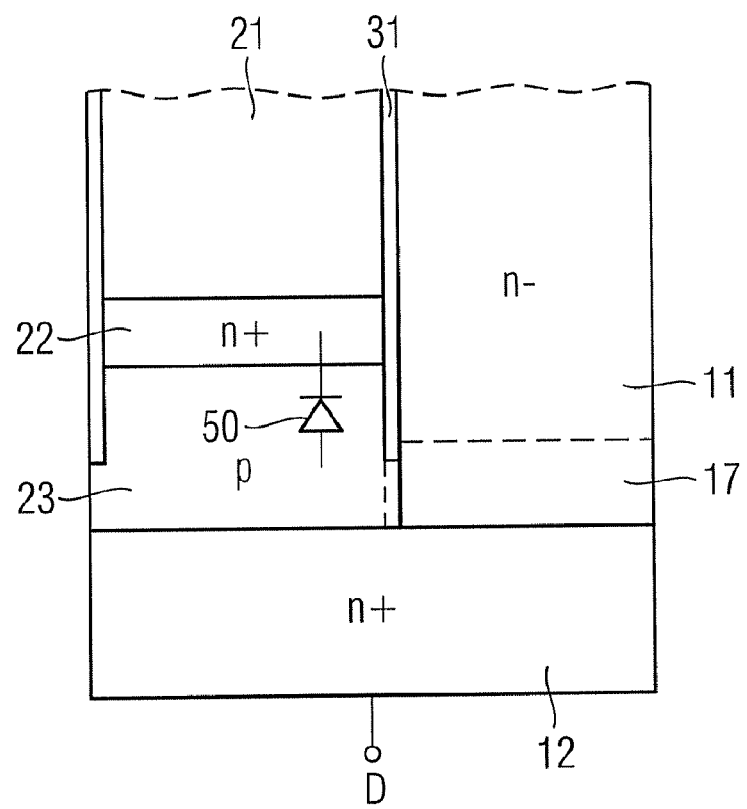
FIG. 4 illustrates an excerpt from a semiconductor component having a drift zone and a drift control zone.

FIG. 4 illustrates a possible realization of the rectifier element 50 on the basis of an excerpt from the semiconductor component. In this example, the drain zone 12 extends over the entire rear side 102 of the semiconductor body 100. The drain zone 12 can be realized, for example, as a highly doped semiconductor substrate to which the other component zones explained above, in one embodiment the drift zone 11 and the drift control zone 21, are applied by epitaxy methods. Between the drain zone 12 and the drift control zone 21 there are two semiconductor zones 22, 23 doped complementarily to one another, a first semiconductor zone 22, which is directly adjacent to the drift control zone 21, and a second semiconductor zone 23, which is arranged between the first connection zone 22 and the drain zone 12. The first semiconductor zone 22 is n-doped in the example illustrated, and the second semiconductor zone 23 is p-doped in the example. In this case, the magnitude of the dopings of the semiconductor zone 22 and/or of the semiconductor zone 23 can vary in a vertical direction. These two semiconductor zones with the pn junction formed between them jointly form the rectifier element 50, the circuit symbol of which is likewise illustrated in FIG. 4 for the sake of better understanding. In the example illustrated, the first connection zone 22 is completely dielectrically insulated from the drift zone 11 by the dielectric layer 31. The second connection zone 23 adjoins the drift zone 11 in sections, but could also be completely dielectrically insulated from the drift zone 11 in a manner corresponding to the first connection zone 22, by virtue of the drift control zone dielectric 31 reaching as far as the drain zone 12, that is illustrated by dashed lines in FIG. 4. For the complete insulation of the drift zone 11 from the second semiconductor zone 23, there is also the possibility of providing, between the drain zone 12 and the drift control zone 11, a connection zone 17 doped more highly than the drift zone 11, the connection zone forming part of the drain zone 12. The connection zone 17 can reach as far as the level of the drift control zone 21 in a vertical direction of the semiconductor body 100.

Figure 5:
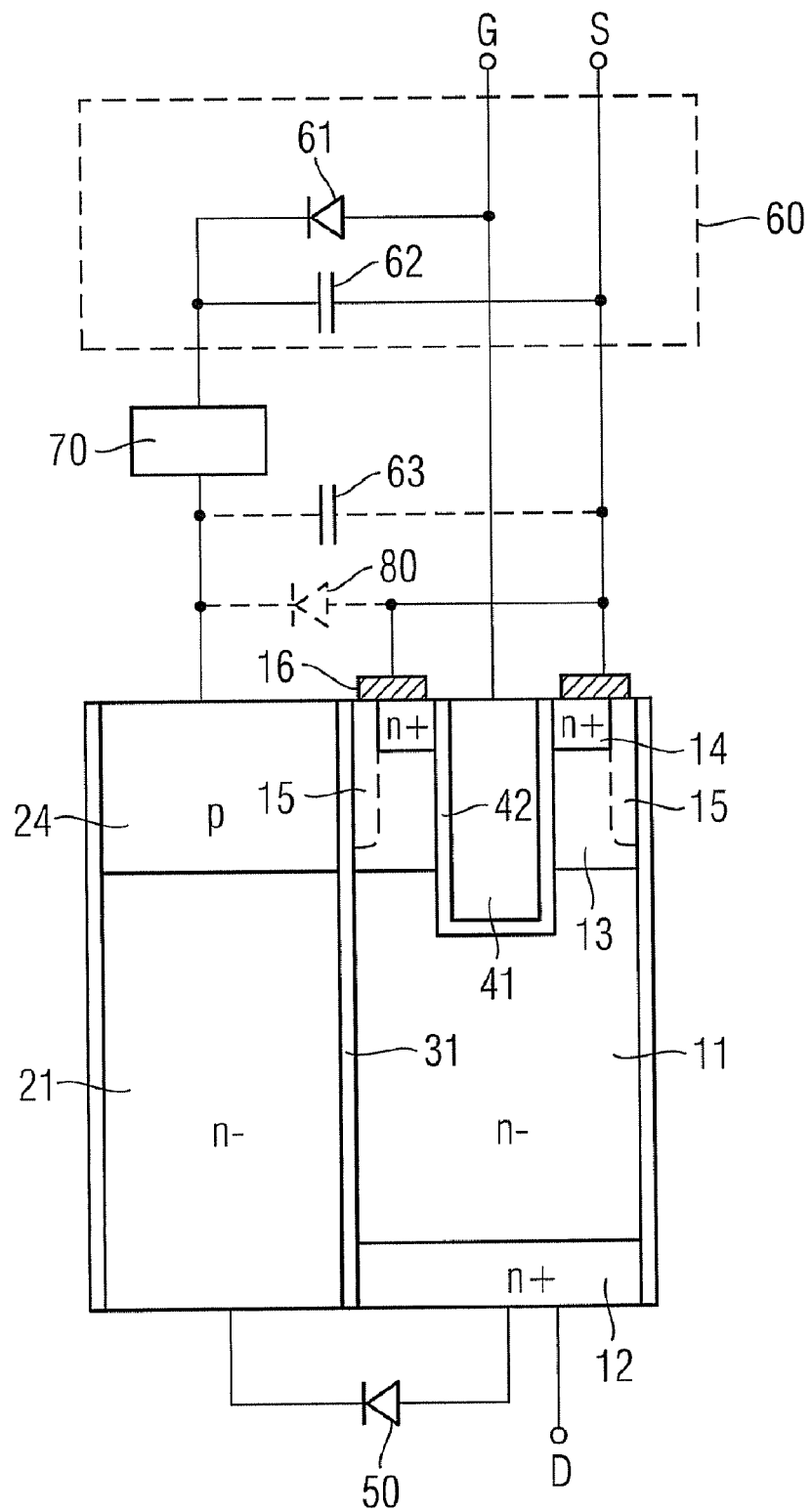
FIG. 5 schematically illustrates a semiconductor component arrangement having a charging circuit in accordance with one embodiment.

A first example of a charging circuit 60 is illustrated in detail in FIG. 5. This charging circuit 60 has a first rectifier element 61, for example, a diode, which is connected between the gate connection G and the decoupling or resistance element 70. In this charging circuit, charging of the drift control zone 21 to an electrical potential that is higher than in the drift zone 11 takes place from the gate circuit or by using a drive circuit (not illustrated) connected to the gate connection G.

The charging circuit 60 additionally includes at least one storage capacitance. The storage capacitance can be the first storage capacitance 63 already explained with reference to FIG. 1, which is connected between the drift control zone 31, or that connection of the decoupling or resistance element 70 which faces the drift control zone 21, on the one hand, and the source zone 14, on the other hand. As an alternative or in addition, a second storage capacitance 62 may be present, which is connected between the source zone 14 and that connection of the decoupling or resistance element 70 which is remote from the drift control zone 21. The storage capacitances 62 and 63 serve to store electrical charge that flows away from the drift control zone 21 when the component is driven in the off state on account of the space charge zone propagating in the drift control zone 21. In the case of the n-channel MOSFET illustrated, the charge carriers are positive charge carriers, that is to say holes. For the case where the decoupling or resistance element 70 is a fuse element, the second storage capacitance 62 is sufficient, in principle.

The two storage capacitances 62, 63 can each be integrated in the semiconductor body 100, but can also be realized as external components. As an alternative or in addition to the storage capacitances 62, 63, further storage capacitances can be integrated in the semiconductor body. In the case of the component illustrated in FIG. 5, such integrated storage capacitances are formed, for example, respectively by the p-doped connection zone 24 of the drift control zone 21, the more highly doped connection region 15 that is arranged in the body zone 13 and is at source potential, and by that section of the dielectric layer 31 which lies between these semiconductor zones 24, 15. Such integrated storage capacitances can, for example, also be realized by trench-type capacitor structures formed in the drift control zone 21 and/or in the connection zone 24. One example provides for realizing the second capacitance 62 as an external capacitance and the first capacitance 63 as such an integrated capacitance.

If the decoupling or resistance element 70 is embodied as a resistor, then the first storage capacitance 63, in one embodiment, enables the component to be switched on and off more rapidly during operation.

In a manner not illustrated more specifically, it is possible to provide a single charging circuit for all the drift control zones of the semiconductor component. Furthermore, there is also the possibility of providing a plurality of charging circuits which are in each case assigned to the drift control zones of a group of transistor cells.

Figure 6:
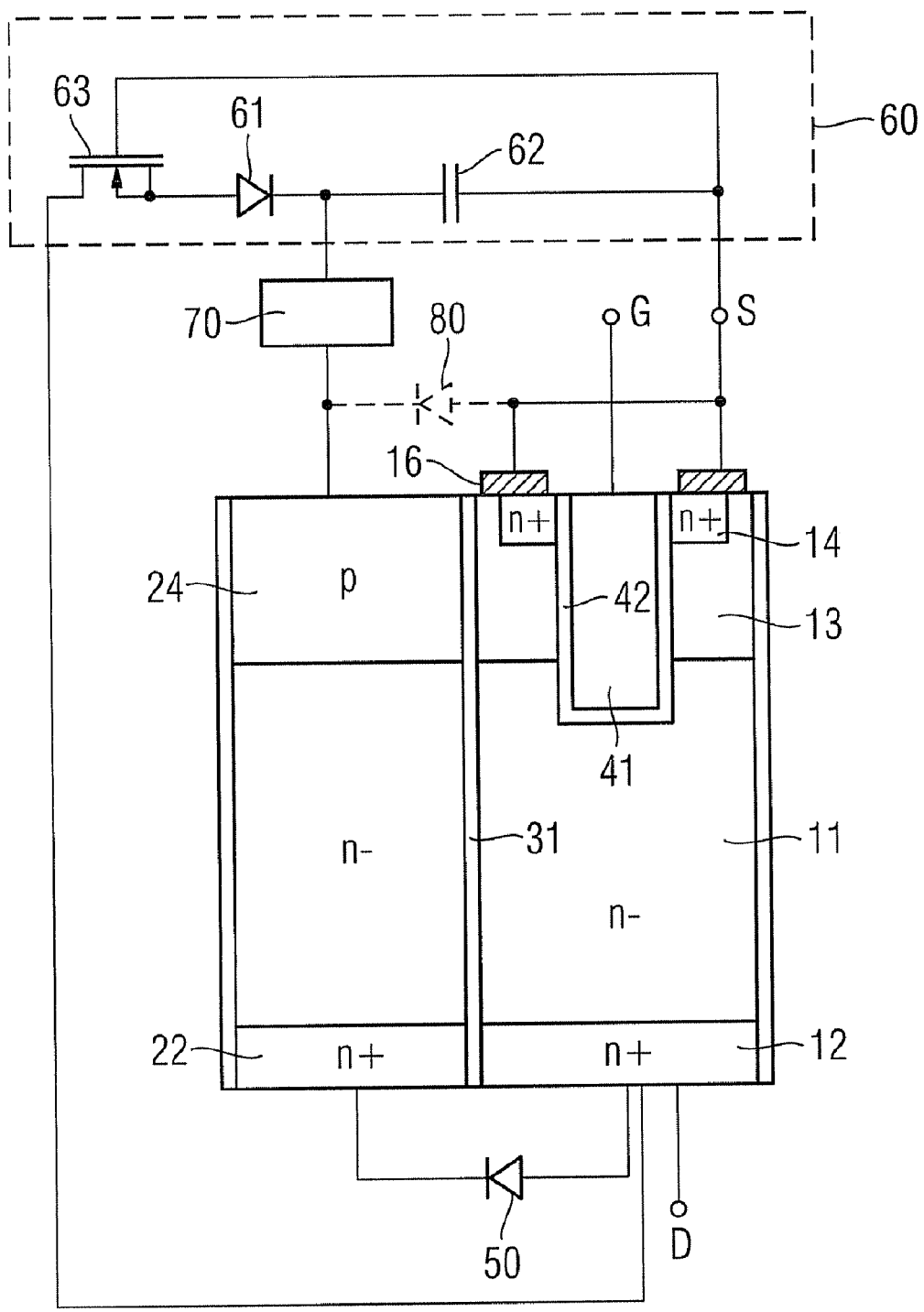
FIG. 6 schematically illustrates a semiconductor component arrangement having a charging circuit in accordance with one embodiment.

FIG. 6 illustrates a further example of the charging circuit 60. This charging circuit has a capacitive storage element 62 connected between the source connection S and the decoupling or resistance element 70. A diode 61 is present for charging the capacitive storage element 62, the diode being connected between the drain zone 12 or the drain connection D and that connection of the capacitance storage element 62 which is remote from the source connection S. In this component, the capacitive storage element 62 is charged via the diode 61 in each case when the component is turned off. As a result, the capacitive storage element 62 stores electrical charge which is required for charging the drift control zone when the component is subsequently switched on again. In order to upwardly limit a charging of the capacitive storage element 62, a normally on transistor is present, the load path of which is connected in series with the diode 61 and the control connection of which is at source potential. The transistor is turned off if a voltage across the series circuit with the diode 61 and the charge storage element 62 reaches the value of its pinch-off voltage. In this way, the maximum voltage drop across the charge storage element 62 and thus the maximum charging of the charge storage element can be set by using the pinch-off voltage of the transistor 62. Analogously to the example in accordance with FIG. 5, a further, optional storage element 63 can be provided in this case, too.

If a fuse element is present between the charging circuit 60 and the drift control zone 21 and the fuse element triggers owing to a defective dielectric layer, such that the drift control zone 21 is decoupled from the charging circuit 60, then the electrical potential of the drift control zone 21 can rise particularly in the upper region, that is to say in the region of the connection zone 24, owing to thermal charge carrier generation. In order to limit this rise in potential, referring to FIGS. 5 and 6, a voltage limiting element 80 can be connected between the drift control zone 21, or the connection zone 24, and the body zone 13, or the source connection S, respectively. The voltage limiting element 80 is a zener diode, for example. In this case, the breakdown voltage of the zener diode determines the maximum potential difference between the electrical potential of the drift control zone 21 and the body zone 13 after the fuse element has triggered.

Figure 7:
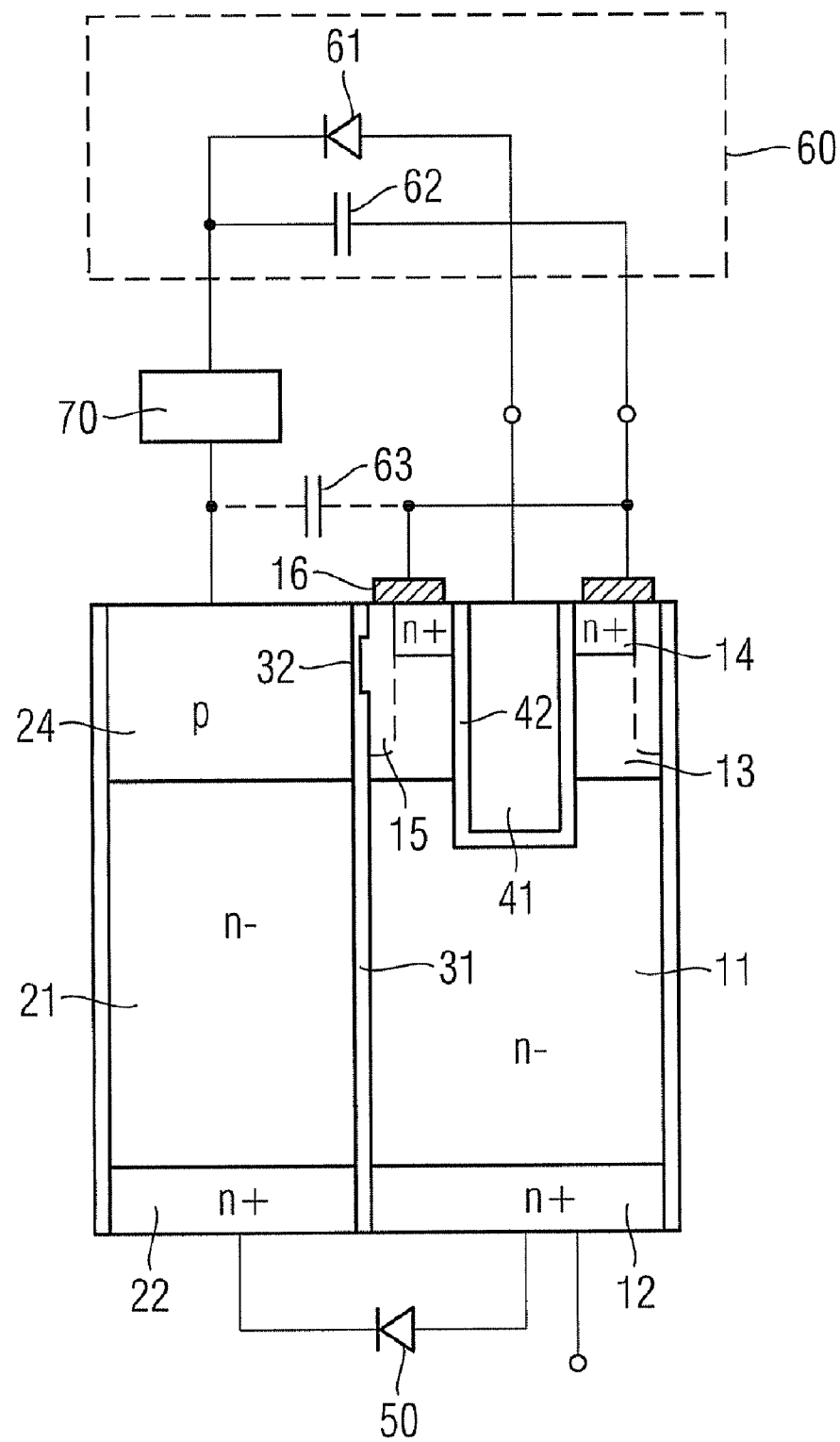
FIG. 7 illustrates a further example of a semiconductor component arrangement.

Referring to FIG. 7, as an alternative to such a voltage limiting element, a "antifuse" can be connected between the drift control zone 21, or the connection zone 24 thereof, and the body zone 13. Such an antifuse is distinguished by the fact that it undergoes transition from an off state permanently into an on state once a triggering condition has been reached. Such a triggering condition is reached, for example, when an electrical voltage present across the antifuse exceeds a predetermined threshold value. Referring to FIG. 7, such an antifuse can be realized by the fact that the dielectric layer 31 has a section 32 having a smaller thickness in a region between the connection zone 24 and the body zone 13. If a potential difference between the connection zone 24 and the body zone 13 exceeds a threshold value that is crucially determined by the thickness in the region of the section 32, then the dielectric layer is destroyed in the region 32 and the connection zone 24 is permanently connected to the body zone 13 and thus to the source. As an alternative to the example illustrated in FIG. 7, in which the "antifuse" is connected between the drift control zone 21 and the connection zone 24 thereof, the "antifuse" can be provided in the region of the drift control zone dielectric 31 in principle at any desired location, that is to say in one embodiment also along the front side 101, between the connection zone 24 and a location having source potential, in one embodiment the source zone 14 or the source metallization (not illustrated more specifically).

Figure 8:
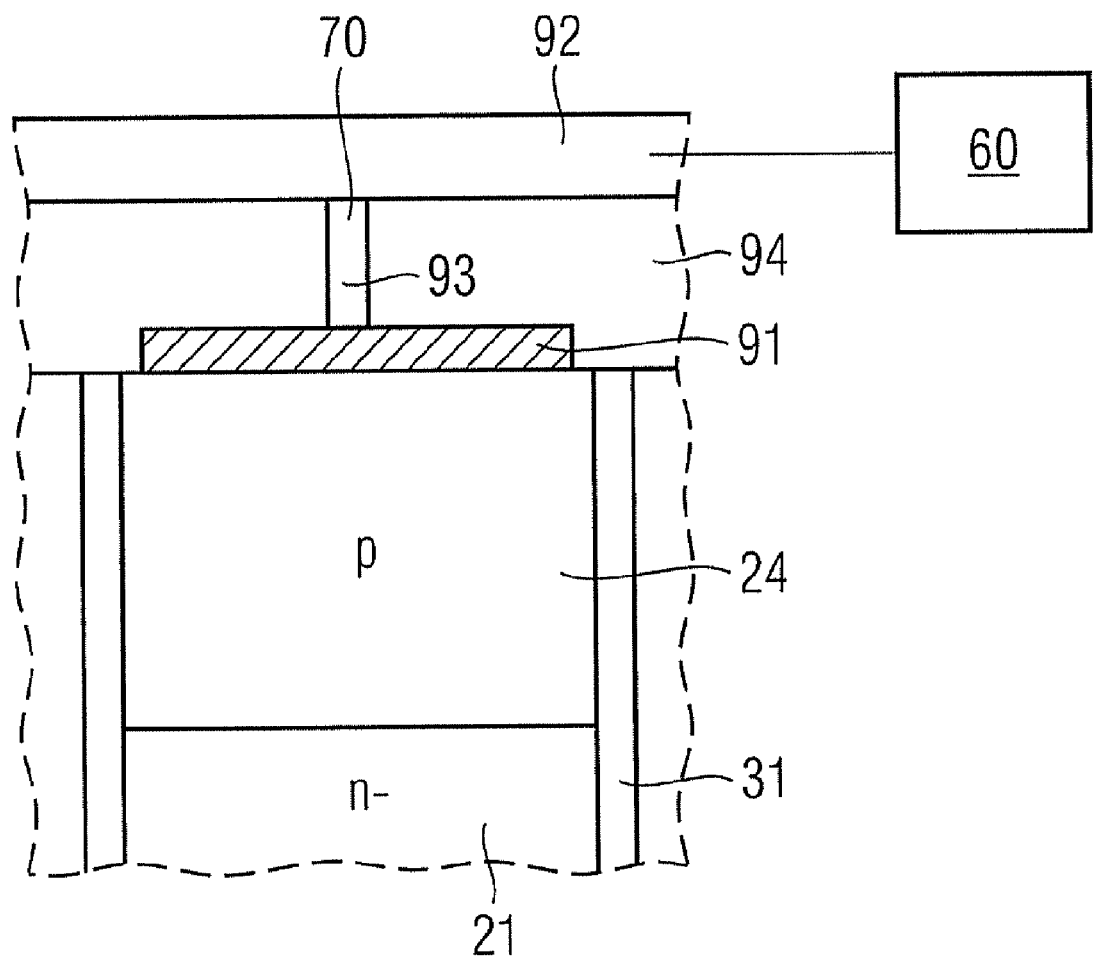
FIG. 8 illustrates a possible realization of a fuse.

A possible realization of a fuse element for permanently decoupling the charging circuit 60 and the drift control zone 21 is illustrated in FIG. 8. In this case, the fuse element 70 is formed as a contact plug 93 between a connection electrode 91, which makes contact with the connection zone 24, and a metallization track 92 arranged at a distance from the connection electrode 91. The charging circuit 60 is connected to the metallization track 92. The metallization track 92 thus serves for distributing the electrical charge supplied by the charging circuit 60 to the individual drift control zones of the component. The contact plug 93 is realized, for example, in such a way that it momentarily tolerates the charging currents supplied by the charging circuit 60, but that it melts and in this way irreversibly interrupts an electrically conductive connection between the metallization track 92 and the drift control zone 21 if such a charging current—owing to a defective location of the dielectric layer 31—flows for longer than a predetermined tolerable time duration.

In the case of the semiconductor component arrangements explained above, the transistor cells of the semiconductor component are realized as trench transistor cells. It goes without saying that the concept explained above, which provides for the individual drift control zones to be connected to the charging circuit 60 via a decoupling or resistance element, is not restricted to the use of such trench transistor cells. Thus, referring to FIG. 9, there is, for example, also the possibility of realizing planar transistor cells. In this case, the gate electrode 41 is arranged above the front side 101 of the semiconductor body. An inversion channel controlled by the gate electrode 41 forms in a lateral direction of the semiconductor body in this component.

Figure 10:
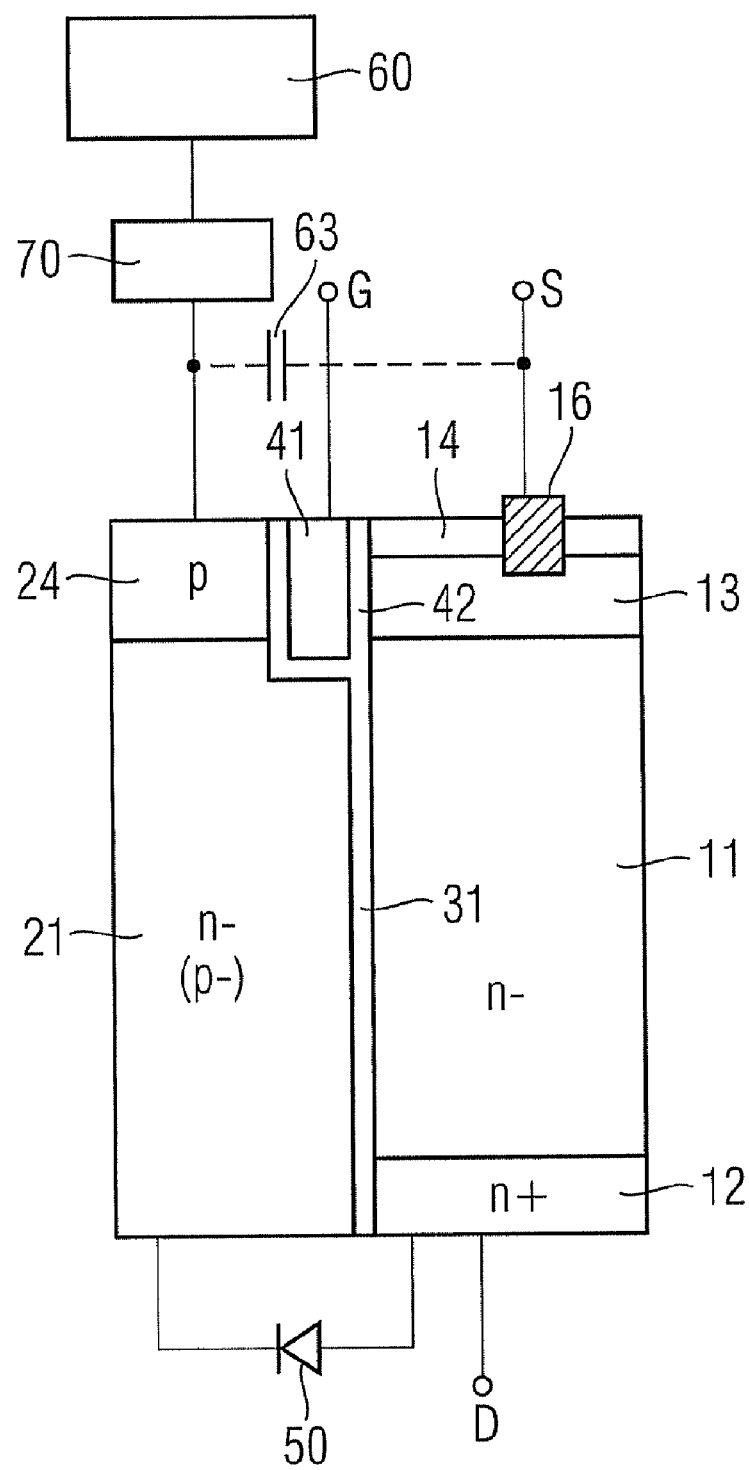
FIG. 10 schematically illustrates a semiconductor component arrangement having a semiconductor component realized as a trench transistor.

It was assumed for the explanations above that the transistor structure of the component explained is a structure of an n-channel MOSFET. The source zone 14 and the drain zone 12 of such an n-conducting MOSFET are n-doped, and the body zone 13 is p-doped. In this component, the gate electrode 41 serves for controlling an inversion channel in the body zone 13 between the source zone 14 and the drift zone 11. In the components explained above, the drift zone 11 is likewise n-doped. In the drift zone, under the control of the electrical potential of the drift control zone 21, an accumulation channel propagates along the dielectric layer 31. For this purpose, the drift control zone 21 can be either n-doped or p-doped. In a departure from the explanation above, the drift zone 11 can also be completely or partly p-doped. In this case, when the component is driven in the on state, an inversion channel propagates in the drift zone 11 along the dielectric layer 31. In the case of an n-conducting component having a p-doped drift zone 11, however, it is necessary to take measures which ensure that when the component is driven in the on state there is an electrically conductive connection between the inversion channel in the body zone 13 and the inversion channel along the dielectric layer 31. FIG. 10 illustrates by way of example a component in which the channels are directly adjacent to one another. In this component, the gate electrode 41 is isolated from the body zone 13 by a gate dielectric 42 situated directly as an extension of the drift control zone dielectric 31. In this component, the drift control zone dielectric 31 and the gate dielectric 42 can be realized in one embodiment as a common dielectric layer. The inversion channel controlled by the gate electrode 41 in the body zone 13 and the accumulation channel (in the case of an n-doped drift zone 11) controlled by the drift control zone 21 along the drift control zone dielectric 31 or inversion channel (in the case of a p-doped drift zone 11) are directly adjacent to one another in this component.

Figure 9:
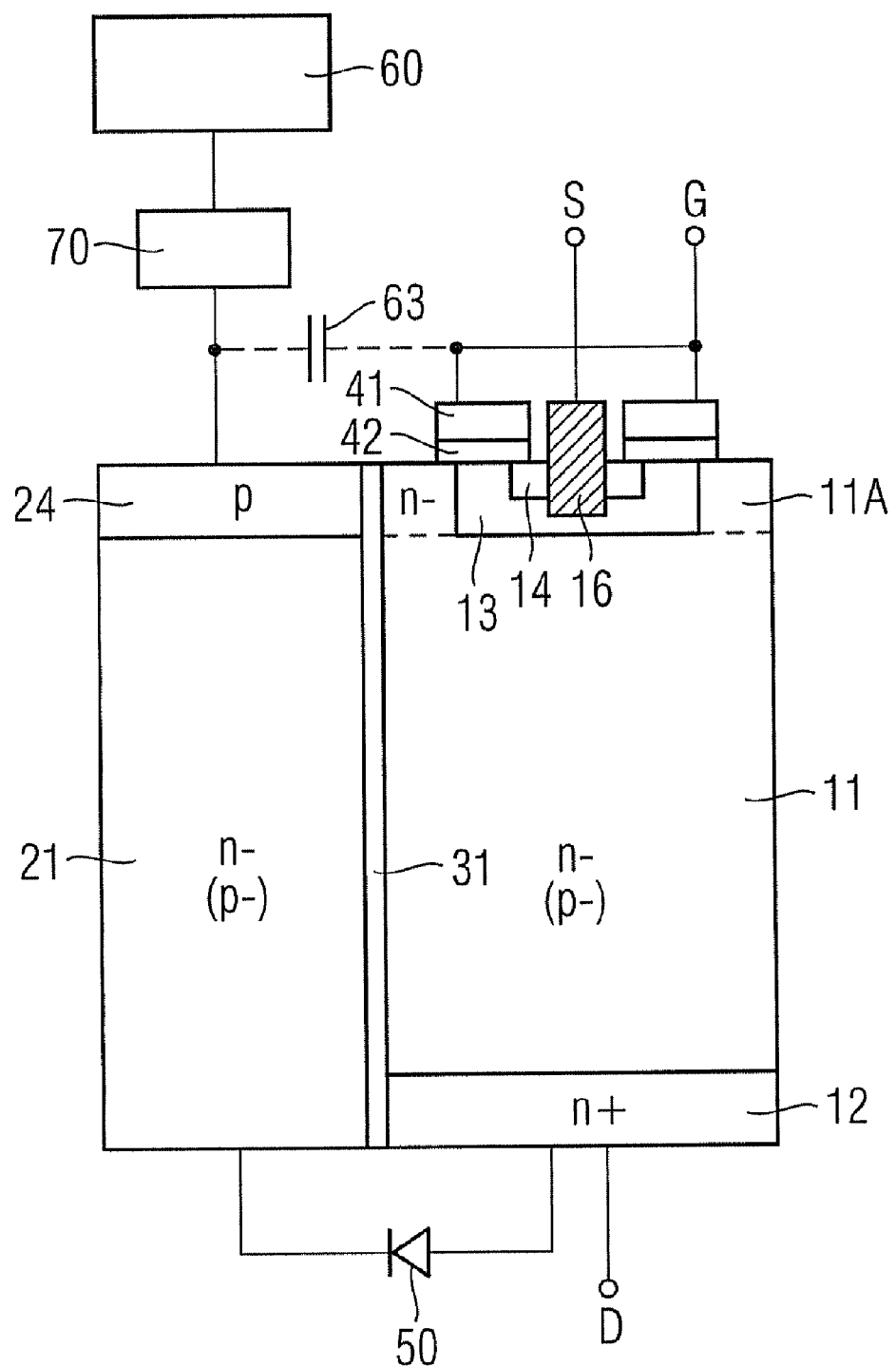
FIG. 9 schematically illustrates a semiconductor component arrangement having a semiconductor component realized as a planar transistor.

In the components explained with reference to FIGS. 1 and 9, the drift zone 11 could be p-doped in the lower region of the component and n-doped in the upper region. In this case, the n-doped region of the drift zone 11 ensures a connection between the inversion channel that forms in the body zone 13 and the inversion channel that forms along the p-doped drift zone section. The reference symbol 11A in FIGS. 1 and 9 designates such drift zone sections which should be n-doped when using a drift zone that is p-doped in the lower region of the component.

Problems with a defective dielectric can also occur in conventional MOS transistors having a gate electrode that is dielectrically insulated from semiconductor regions of the MOS transistor by a gate dielectric. If the gate dielectric is defective to the extent that locally there is a short circuit between the gate electrode and the surrounding semiconductor regions, then increased driving losses can occur in such a conventional MOS transistor. In order to reduce the driving losses in the case of a defective gate dielectric, therefore, a decoupling or resistance element can be connected to the gate electrodes of individual transistor cells of the component.

In order to illustrate this principle, FIG. 11 illustrates a cellularly constructed MOS transistor in cross section. In this case, reference symbols identical to those in the Figures explained above designate identical component regions of this component. The transistor illustrated differs from the components explained above essentially by virtue of the fact that there is no drift control zone with a drift control zone dielectric. Each of the transistor cells of the MOS transistor illustrated in FIG. 11 has a source zone 14 and a body zone 13, which is doped complementarily to the source zone 14 and is arranged between the source zone 14 and a drift zone 11. In the component illustrated, the drift zone 11 is common to all the transistor cells of the component. Adjacent to the drift zone 11 is a drain zone, which is of the same conduction type as the drift zone 11 in the case of a MOS transistor realized as a MOSFET and which is doped complementarily to the drift zone 11 in the case of a MOS transistor realized as an IGBT.

The transistor cells of the component illustrated in FIG. 11 are realized as trench transistor cells. In this case, the individual gate electrodes 41 of the transistor cells extend into the semiconductor body in a vertical direction proceeding from the front side 101 of the semiconductor body 100. In this case, the gate electrodes 41 extend through the source zone 14 and the body zone 13 right into the drift zone 11 and are dielectrically insulated from the source zone 14, the body zone 13 and the drift zone 11 by a gate dielectric 42. The doping types indicated in FIG. 11 relate to an n-channel MOSFET or n-channel IGBT. These doping types should be understood merely as an example. It goes without saying that the individual semiconductor zones can also be doped complementarily in order then to obtain a p-channel MOSFET or p-channel IGBT, respectively.

The gate electrodes 41 of the individual transistor cells serve, in a known manner, for controlling an inversion channel in the body zones 13 between the source zones 14 of the drift zone 11. In the n-conducting transistor illustrated in FIG. 11, such conducting channels form in the body zone 13 when the gate electrode 41 is at a positive electrical potential with respect to the source potential. If the gate dielectric 42 surrounding the respective gate electrode 41 is locally defective, such that there is a short circuit between the gate electrode 41 and the source zone 14, the body zone 13 or the drift zone 11, then either the electrical potential of the gate electrode 41 cannot rise above the electrical potential of the source zone 14 or considerable driving losses occur since the electrical charge that flows away via the short circuit in the gate dielectric 42 has to be permanently resupplied by using a drive circuit. The drive circuit, which is connected to the gate connection G of the transistor, is illustrated by dashed lines in FIG. 11 and designated by the reference symbol 80. The drive circuit 80 can be a conventional drive circuit for driving a MOS transistor. In order to avoid increased driving losses that can occur in the case of a defective gate dielectric 42, decoupling or resistance elements 70 are provided, which are connected between the gate connection G of the component and the individual gate electrodes 41 of the individual transistor cells. In the example illustrated in FIG. 11, such a decoupling or resistance element is assigned to each of the gate electrodes 41. It goes without saying that there is also the possibility of connecting a plurality of gate electrodes to the gate connection G via a common decoupling or resistance element.

The construction and functioning of the decoupling or resistance elements 70 correspond to the construction and the functioning of the decoupling or resistance elements explained above, such that reference is made to these explanations. Fuses which trigger when an overvoltage or an overcurrent is applied are suitable, in one embodiment, as decoupling or resistance elements. There is the possibility of testing the component at the factory by applying between gate G and source S a voltage that is higher than the gate-source voltage that occurs during normal operation. If short circuits in the gate dielectric 42 of individual transistor cells occur as a result of the voltage being applied, then this high test voltage is present across the fuse element 70 after the occurrence of the short circuit in the gate dielectric 42, the fuse element being dimensioned in such a way that it triggers at the test voltage. In this way, the transistor cells which have a defective dielectric 42 are automatically deactivated at the factory. It goes without saying that the test explained above can also be carried out by the customer or in an application circuit.

Finally, it should also be pointed out that decoupling or resistance elements can, of course, also be provided between the gate connection G and the gate electrodes 41 of the individual transistor cells in the components explained above with reference to FIGS. 1 to 10.

It should be pointed out that component features which have only been explained in connection with one example can be combined with component features from other examples even when this has not been explicitly explained previously. Thus, in particular, features that are represented in one of the following claims can be combined with features of any other claims.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor component comprising:
   a semiconductor component having a drift zone;
   a first connection zone, which is adjacent to the drift zone and is doped more highly than the drift zone;
   a drift control zone arranged adjacent to the drift zone and coupled to the first connection zone;
   a drift control zone dielectric arranged between the drift zone and the drift control zone, at least one rectifier element arranged between the first connection zone and the drift control zone;
   a charging circuit connected to the drift control zone; and
   at least one of a decoupling element and a resistance element connected between the charging circuit and the drift control zone;
   wherein the decoupling element is configured to interrupt an electrically conductive connection between the charging circuit and the drift control zone depending on one of temperature prevailing at the decoupling element, a voltage present at the decoupling element, and a current flowing through the decoupling element.

2. The semiconductor component of claim 1, wherein the resistance element connected between the charging circuit and the drift control zone has a resistance value of greater than 1 MΩ).

3. The semiconductor component of claim 2, wherein the resistance value is greater than 10 MΩ or greater than 100 MΩ.

4. The semiconductor component of claim 1, wherein the decoupling element is designed to irreversibly interrupt the electrically conductive connection between the charging circuit and the drift control zone.

5. The semiconductor component of claim 1, wherein the decoupling element is realized as a fuse.

6. The semiconductor component of claim 1, comprising a plurality of drift zones and a plurality of drift control zones, a drift zone in each case being arranged adjacent to a drift control zone, wherein a decoupling element or a resistance element is connected between each of the drift control zones and the charging circuit.

7. The semiconductor component of claim 1, configured as a MOS transistor, wherein the first connection zone forms a drain zone, and which furthermore comprises:
   a source zone,
   a body zone arranged between the source zone and the drift zone,
   a gate electrode arranged adjacent to the body zone, and a gate dielectric arranged between the gate electrode and the body zone.

8. The semiconductor component of claim 7, wherein the charging circuit comprises:
   a rectifier element connected between the gate electrode and the decoupling element.

9. The semiconductor component of claim 8, wherein the rectifier element is a bipolar diode or a Schottky diode.

10. The semiconductor component of claim 8, wherein the charging circuit furthermore comprises:
    a capacitive storage element connected between the source zone and the decoupling element.

11. The semiconductor component of claim 8, wherein the charging circuit furthermore comprises:
    a capacitive storage element connected between the source zone and the drift control zone.

12. The semiconductor component of claim 7, wherein the drain zone is of the same conduction type as the drift zone and the body zone is doped complementarily to the drift zone.

13. The semiconductor component of claim 7, wherein the drift zone is doped complementarily to the drain zone and is of the same conduction type as the body zone.

14. The semiconductor component of claim 7, wherein the drift zone is intrinsic.

15. The semiconductor component of claim 7, wherein a voltage limiting element is connected between the body zone and the drift control zone.

16. The semiconductor component of claim 15, wherein the voltage limiting element is embodied as a zener diode.

17. The semiconductor component of claim 1, wherein the drift control zone is of the same conduction type as the drift zone.

18. The semiconductor component of claim 1, wherein the drift control zone is doped complementarily to the drift zone.

19. The semiconductor component of claim 1, wherein the drift control zone is intrinsic.

20. An integrated circuit comprising:
    a semiconductor component having a drift zone;
    a first connection zone, which is adjacent to the drift zone and is doped more highly than the drift zone;
    a drift control zone arranged adjacent to the drift zone and coupled to the first connection zone;
    a drift control zone dielectric arranged between the drift zone and the drift control zone, at least one rectifier element arranged between the first connection zone and the drift control zone;
    a charging circuit connected to the drift control zone;
    means coupled between the charging circuit and the drift control zone for limiting current flow away from the charging circuit into the drift control zone; and
    one of a decoupling element configured to interrupt an electrically conductive connection between the charging circuit and the drift control zone depending on one of a temperature prevailing at the decoupling element, a voltage present at the decoupling element, and a current flowing through the decoupling element, and a resistance element connected between the charging circuit and the drift control zone has a resistance value of greater than 1 MΩ.

* * * * *

UNITED STATES PATENT AND TRADEMARK OFFICE
CERTIFICATE OF CORRECTION

PATENT NO. : 7,829,940 B2
APPLICATION NO. : 12/163037
DATED : November 9, 2010
INVENTOR(S) : Hirler et al.

Page 1 of 1

It is certified that error appears in the above-identified patent and that said Letters Patent is hereby corrected as shown below:

Column 15, line 44, Claim 1, delete "of temperature" and insert in place thereof --of a temperature--.

Column 15, line 50, Claim 2, delete "M$\Omega$) ." and insert in place thereof --M$\Omega$.--.

Signed and Sealed this
Eighth Day of March, 2011

David J. Kappos
*Director of the United States Patent and Trademark Office*